United States Patent [19]

Neuman et al.

[11] Patent Number: 4,965,093

[45] Date of Patent: Oct. 23, 1990

[54] CHEMICAL VAPOR DEPOSITION OF BISMUTH OXIDE

[75] Inventors: George A. Neuman; Karl H. Bloss, both of Pittsburgh, Pa.

[73] Assignee: PPG Industries, Inc., Pittsburgh, Pa.

[21] Appl. No.: 219,693

[22] Filed: Jul. 5, 1988

[51] Int. Cl.$^5$ .......................... B05D 5/12; B05D 5/06
[52] U.S. Cl. .............................. 427/109; 427/126.2; 427/126.3; 427/166; 427/226; 427/255; 427/255.3
[58] Field of Search .................. 427/109, 126.3, 126.2, 427/166, 255.3, 226, 255

[56] References Cited

U.S. PATENT DOCUMENTS

| | | | |
|---|---|---|---|
| 3,019,136 | 1/1962 | Auffenorde et al. | 427/110 |
| 3,107,177 | 10/1963 | Saunders et al. | 117/211 |
| 3,677,814 | 7/1972 | Gillery | 117/211 |
| 3,710,074 | 1/1973 | Stewart | 219/203 |
| 4,069,630 | 1/1978 | Chess et al. | 52/172 |
| 4,187,336 | 2/1980 | Gordon | 428/34 |
| 4,206,252 | 6/1980 | Gordon | 427/160 |
| 4,263,335 | 4/1981 | Wagner et al. | 427/29 |
| 4,308,316 | 12/1981 | Gordon | 428/336 |
| 4,377,613 | 3/1983 | Gordon | 428/212 |
| 4,510,190 | 4/1985 | Glaser | 428/34 |

OTHER PUBLICATIONS

*Condensed Chemical Dictionary*, 6th ed., Rheinhold, N.Y., 1961, p. 1174.

*Primary Examiner*—Janyce Bell
*Attorney, Agent, or Firm*—Donna L. Seidel

[57] ABSTRACT

Novel organometallic coating compositions comprising organo bismuth compounds are disclosed, along with a method for chemical vapor deposition to form bismuth oxide films on the surface of a substrate such as glass.

10 Claims, No Drawings

CHEMICAL VAPOR DEPOSITION OF BISMUTH OXIDE

BACKGROUND OF THE INVENTION

The present invention relates generally to the art of infrared-reflecting coated glass products, and more particularly to non-iridescent, high transmittance, low emissivity, infrared-reflecting coated glass products.

Transparent infrared-reflecting films such as tin oxide may be deposited on a substrate such as glass by a variety of methods, including the application of thermally decomposable compounds to a heated surface. Useful methods for forming transparent infrared-reflecting tin oxide films are taught in U.S. Pat. No. 3,107,177 to Saunders et al, U.S. Pat. No. 3,677,814 to Gillery, and U.S. Pat. No. 4,263,335 to Wagner et al.

Tin oxide films are especially effective infrared reflectors at thicknesses of about 1000 to 8000 Angstroms. However, at such thicknesses the films tend to display interference effects, i.e., multiple visible colors commonly referred to as iridescence. These interference effects render the coated glass aesthetically unacceptable for most architectural applications. Iridescence is not observed in thinner films; however, these films have insufficient infrared reflectance to be practically useful. Likewise, iridescence is not observed in thicker films; however, these films tend to be hazy and difficult to deposit uniformly. Therefore, various methods to mask interference effects have been developed.

U.S. Pat. No. 3,710,074 to Stewart discloses an electrically heated multiple glazed window unit having an electroconductive coating on an enclosed surface and a selective reflecting film having an absolute infrared reflectance of at least 0.7 to improve the heat insulating character of the unit and reduce the visible iridescence of the conductive film.

U.S. Pat. No. 4,069,630 to Chess et al discloses a heat reflecting multiple glazed window comprising a colored, heat absorbing exterior glass sheet having a heat reflecting tin oxide film on its interior surface, and an interior glass sheet which may be either clear glass or colored. The tin oxide film typically has an interference color from first order red to fourth order red, the visual effect of which is attenuated by the colored heat absorbing glass.

U.S. Pat. Nos. 4,187,336; 4,206,252 and 4,308,316 to Gordon disclose transparent glass window structures comprising a glass sheet bearing a first coating of infrared reflective material, wherein the observance of iridescence resulting from the first coating is reduced by a second coating of particular refractive index and thickness providing at least two interfaces forming means to reflect and refract light to interfere with the observance of iridescence.

U.S. Pat. No. 4,377,613 to Gordon discloses transparent window structures comprising a glass sheet bearing a coating of infrared reflective material wherein the observance of iridescence is reduced by provision of a very thin coating system beneath the infrared reflective coating which reflects and refracts light to interfere with the observation of iridescence.

U.S. application Ser. No. 768,922 filed Aug. 23, 1985, by V. A. Henery et al discloses an alternative method for masking the visible interference effects of an infrared reflecting film in a window unit, which involves masking the visible interference effects of an infrared reflecting film by means of a second film having a uniform reflectance in the visible wavelength range combined with a luminous reflectance which is significantly higher than that of the infrared reflecting film. To produce a high transmittance, low emissivity unit, the thickness of the infrared reflecting film is preferably chosen to correspond with the first minimum in the reflectance curve.

SUMMARY OF THE INVENTION

The present invention provides a method for chemical vapor deposition of films of bismuth oxide by the oxidative pyrolysis of an organobismuth coating reactant, particularly arylbismuthines, alkoxyarylbismuthines and alkenylbismuthines.

DESCRIPTION OF THE PREFERRED EMBODIMENTS

Infrared reflecting films exhibiting visible interference effects may be useful on a monolithic sheet. Preferred articles in accordance with the present invention are multiple glazed window units comprising at least two panes, preferably both glass. Conventional glass compositions are useful, especially typical soda-lime-silica glass produced on a float line. Heat absorbing tinted glasses may be employed; but for high transmittance applications, clear glass is preferred.

Of the various infrared reflecting films which may be useful for solar energy control, tin oxide is preferred. Tin oxide films may be deposited on glass surfaces by a variety of methods such as pyrolytic deposition, powder coating, chemical vapor deposition and cathode sputtering. Suitable methods include pyrolysis of alkyltin fluorides as taught in U.S. Pat. No. 3,677,814 to Gillery and U.S. Pat. No. 4,263,335 to Wagner et al; chemical vapor deposition as taught in U.S. Pat. No. 3,850,679 to Sopko et al; powder coating as taught in U.S. Pat. No. 4,325,988 to Wagner and U.S. Pat. No. 4,344,986 to Henery; and cathode sputtering as taught in U.S. Pat. Nos. 3,477,936 and 3,506,556 to Gillery et al.

Preferred tin oxide infrared reflecting films have a resistivity less than about 50 ohms per square, more preferably in the range of 20 to 30 ohms per square, and a low emissivity, preferably less than 0.4. The thickness of the film is chosen to correspond with a minimum in the luminous reflectance curve. Preferably, the film thickness corresponds to the first minimum since this point represents the lowest visible reflectance obtainable for a tin oxide film. This point corresponds with the second order blue interference effect at a thickness of about 1400 Angstroms. Coating process parameters are adjusted to yield the minimum resistivity for the given thickness to provide maximum infrared reflectance and minimum emissivity. If lower resistivity is desired for higher solar energy performance, a thicker infrared reflecting tin oxide film may be formed, preferably at a thickness near the second minimum in the luminous reflectance curve, most preferably at the thickness corresponding with the third order blue interference effect, about 2750 Angstroms.

In the preferred embodiment wherein the thickness of the tin oxide infrared reflecting film corresponds with the first minimum in the spectral reflectance curve, the film typically appears blue by interference effects, the visible reflectance is about 10 percent, and the resistivity is generally about 45 to 50 ohms per square.

While tin oxide has achieved widespread use because of its durability as well as its infrared reflecting properties, in some optical applications a higher refractive index coating, i.e. a refractive index greater than 2.0, is desired. Two well known high refractive index coatings are zinc sulfide and titanium oxide. However, each has a serious drawback. Zinc sulfide is not sufficiently durable for many purposes, while titanium oxide has a characteristic absorption which produces a blue color. Bismuth oxide, which has a refractive index of 2.4, is colorless, but when produced by sputtering is not durable. Bismuth oxide produced by chemical vapor deposition in accordance with the present invention is durable and colorless, and has a high refractive index of 2.4.

Preferred organobismuth compounds for the chemical vapor deposition of bismuth oxide in accordance with the present invention are aryl bismuthines, preferably triarylbismuthines, most preferably triphenylbismuthine. However, other organobismuthines, such as alkyl, alkenyl, alkoxy, aralkyl and fluoro derivatives thereof, which have suitable thermal stability and pyrolyzability, may be used as well. Preferred organobismuth compounds include air and water stable, colorless, nontoxic and relatively odorless crystalline compounds.

Trialkylbismuthines are not particularly preferred for chemical vapor deposition because they react too readily with oxygen or water, as do most aralkylbismuthines. However, most trialkenylbismuthines, while sensitive to air, are clear liquids with suitable vapor pressure and sufficient stability for chemical vapor deposition, as are alkoxyarylbismuthines which resemble the triarylbismuthines. The colorless liquid diphenylethylbismuthine may also be suitable. The present invention will be further understood from specific examples which follow.

EXAMPLE I

Coated glass samples are made using a bench scale kinetic coater, a modified cold-wall reactor. The glass samples are placed on a metal block which is heated by induction to approximately 950° F. (about 510° C). An air carrier stream, with approximately 0.01 mole % of triphenylbismuthine, is passed over the sample at a flow rate of 10 centimeters per second for about 8 minutes. Bismuth oxide films approximately 150 Angstroms thick are deposited.

EXAMPLE II

A glass substrate is placed in a ceramic tube approximately one inch in diameter and eight inches long. A high temperature heating tape is placed around the area where the substrate resides. A Teflon stopper with a gas inlet line is placed on one end of the ceramic tube. A gas outlet, along with a thermocouple, is placed on the other end of the ceramic tube. The substrate is heated to about 1200° F. (about 649° C.). An air carrier stream, with about 0.1 mole % of triphenylbismuthine, is passed through the ceramic tube at a flow rate of about 5 centimeters per second. Five samples are produced using this method ranging in film thickness from 100 to 1200 Angstroms.

The above examples are offered only to illustrate the present invention. Optimization of the coating apparatus, process parameters, and composition are expected to provide improved durable, colorless, high refractive index bismuth oxide films, and are included within the scope of the invention. Other aryl, alkoxyaryl and alkenyl bismuth compounds may be used to produce bismuth oxide films in accordance with the present invention based on their thermal stability and pyrolyzability. The scope of the present invention is defined by the following claims.

What is claimed is:

1. A method of forming a bismuth oxide coating by chemical vapor deposition comprising the steps of:
   a. contacting a surface of a substrate in an oxidizing atmosphere with a water stable organo bismuth compound;
   b. maintaining a temperature sufficient to thermally decompose said organo bismuth compound; and
   c. thermally decomposing said organo bismuth compound in vapor form to deposit a bismuth oxide film on said surface.

2. A method according to claim 1, wherein said substrate is glass.

3. A method according to claim 2, wherein said organo bismuth compound is combined with a carrier gas to form a mixture.

4. A method according to claim 3, wherein said carrier gas is air.

5. A method according to claim 4, wherein said organo bismuth compound is selected from the group consisting of arylbismuthines and alkenylbismuthines.

6. A method according to claim 5, wherein said organo bismuth compound is selected from the group consisting of triarylbismuthines, aralkylbismuthines, alkoxyarylbismuthines, and trialkenylbismuthines.

7. A method according to claim 6, wherein said triarylbismuthine is selected from the group consisting of triphenyl bismuthine and tri-2,4-xylyl bismuthine.

8. A method according to claim 7, wherein said aryl bismuth compound is triphenyl bismuthine.

9. A method according to claim 8, wherein said substrate is contacted with triphenyl bismuthine at a temperature of at least 350° C.

10. A method according to claim 9, wherein said substrate is contacted with triphenyl bismuthine at a temperature in the range of 500° to 650° C.

* * * * *